United States Patent
Chen et al.

(10) Patent No.: US 6,881,996 B2
(45) Date of Patent: Apr. 19, 2005

(54) METAL-INSULATOR-METAL (MIM) CAPACITOR STRUCTURE IN COPPER-CMOS CIRCUITS USING A PAD PROTECT LAYER

(75) Inventors: Chun-Hon Chen, Hsin-Chu (TW); Ssu-Pin Ma, Taipei (TW); Ta-Hsun Yeh, Hsin-Chu (TW); Yen-Shih Ho, Shan-Hua (TW); Kuo-Reay Peng, Hsin-Chu (TW); Heng-Ming Hsu, Hsin-Chu (TW); Kong-Beng Thei, Hsin-Chu (TW); Chi-Wu Chou, Hsin-Chu (TW)

(73) Assignee: Taiwan Semiconductor Manufacturing Company, Hsinchu (TW)

(*) Notice: Subject to any disclaimer, the term of this patent is extended or adjusted under 35 U.S.C. 154(b) by 0 days.

(21) Appl. No.: 10/935,376

(22) Filed: Sep. 7, 2004

(65) Prior Publication Data
US 2005/0029566 A1 Feb. 10, 2005

Related U.S. Application Data

(62) Division of application No. 10/167,856, filed on Jun. 11, 2002, now Pat. No. 6,812,088.

(51) Int. Cl.[7] .................................................. H01L 27/108
(52) U.S. Cl. ...................... 257/296; 257/306; 257/532
(58) Field of Search ............................... 257/296, 300, 257/306, 308, 310, 311, 532, 535; 438/250, 253, 396

(56) References Cited

U.S. PATENT DOCUMENTS

| | | |
|---|---|---|
| 5,406,447 A | 4/1995 | Miyazaki .................. 301/313 |
| 5,812,364 A | 9/1998 | Oku et al. ................. 361/312 |
| 5,879,981 A * | 3/1999 | Tanigawa ................... 438/241 |
| 5,926,359 A | 7/1999 | Greco et al. ............... 361/311 |
| 5,946,567 A | 8/1999 | Weng et al. ................ 438/250 |
| 6,313,003 B1 | 11/2001 | Chen ......................... 438/396 |
| 6,329,234 B1 * | 12/2001 | Ma et al. ................... 438/210 |
| 6,534,374 B1 | 3/2003 | Johnson et al. ............ 438/381 |
| 2001/0020713 A1 * | 9/2001 | Yoshitomi et al. ........ 257/306 |
| 2002/0056869 A1 | 5/2002 | Morimoto .................. 257/313 |
| 2002/0155676 A1 | 10/2002 | Stetter et al. ............. 438/396 |
| 2002/0192919 A1 * | 12/2002 | Bothra ...................... 438/381 |

* cited by examiner

*Primary Examiner*—Tuan H. Nguyen
(74) *Attorney, Agent, or Firm*—Thomas, Kayden, Horstemeyer & Risley

(57) ABSTRACT

A metal-insulator-metal (MIM) capacitor structure and method of fabrication for CMOS circuits having copper interconnections are described. The method provides metal capacitors with high figure of merit Q ($X_c/R$) and which does not require additional masks and metal layers. The method forms a copper capacitor bottom metal (CBM) electrode while concurrently forming the pad contacts and level of copper interconnections by the damascene process. An insulating ($Si_3N_4$) metal protect layer is formed on the copper and a capacitor interelectrode dielectric layer is formed. A metal protecting buffer is used to protect the thin interelectrode layer, and openings are etched to pad contacts and interconnecting lines. A TiN/AlCu/TiN metal layer is deposited and patterned to form the capacitor top metal (CTM) electrodes, the next level of interconnections, and to provide a pad protect layer on the copper pad contacts. The thick TiN/AlCu/TiN CTM electrode reduces the capacitor series resistance and improves the capacitor figure of merit Q, while the pad protect layer protects the copper from corrosion.

8 Claims, 5 Drawing Sheets

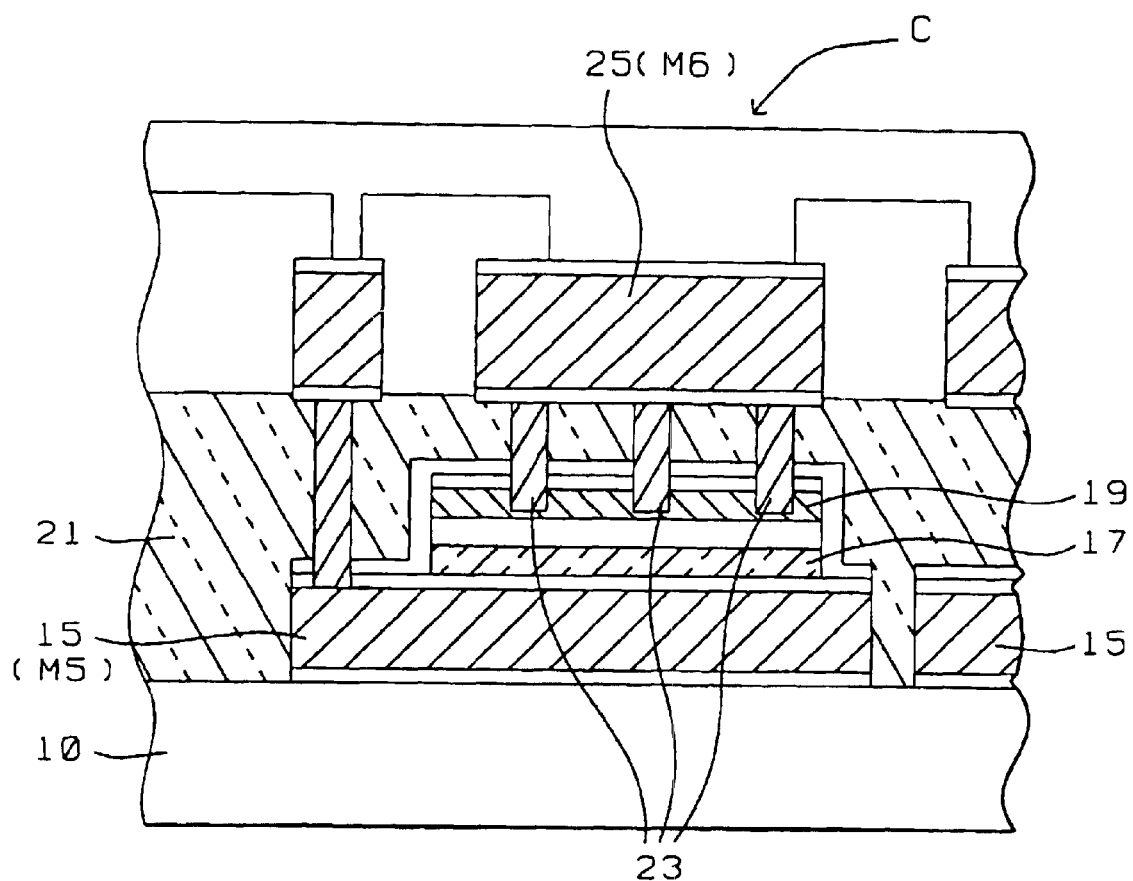
FIG. 1 – Prior Art
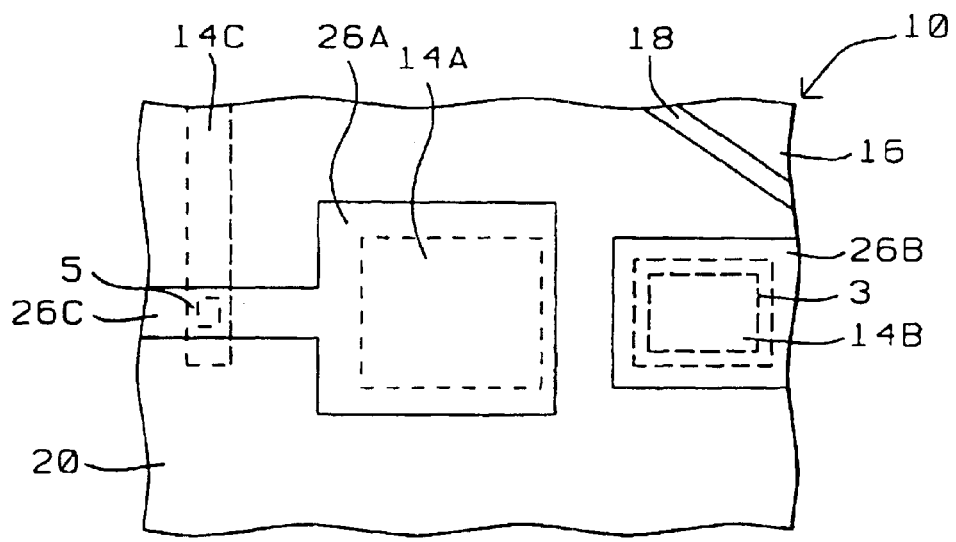
FIG. 2

US 6,881,996 B2

METAL-INSULATOR-METAL (MIM) CAPACITOR STRUCTURE IN COPPER-CMOS CIRCUITS USING A PAD PROTECT LAYER

This application is a DIV of U.S. Ser. No. 10/167,856, filed Jun. 11, 2002, now U.S. Pat. No. 6,812,088.

BACKGROUND OF THE INVENTION (1) Field of the Invention

The present invention relates to a method for making metal capacitors for integrated circuits, and more particularly relates to a method for making metal-insulator-metal (MIM) capacitor structures compatible with copper metallization schemes for wiring-up CMOS circuits. The MIM capacitors utilize the pad protect layer with copper (Cu) bottom electrodes and aluminum/copper (Al/Cu) top electrodes to achieve high capacitance per unit area while providing low series resistance resulting in a circuit having capacitors with high figure of merit Q.

(2) Description of the Prior Art

Capacitors on semiconductor chips are used for various integrated circuit applications. For example, these on-chip MIM capacitors can be used for mixed signal (analog/digital circuits) applications and radio frequency (RF) circuits. These capacitors can also serve as decoupling capacitors to provide improved voltage regulation and noise immunity for power distribution.

Typically these capacitors are integrated into the semiconductor circuit when the semiconductor devices are formed on the substrate. For example, the one or two doped patterned polysilicon layers used to make the field effect transistors (FETs) and/or bipolar transistors can also be used to form the capacitors. Alternatively, the capacitors can be fabricated using the multilevels of interconnecting metal patterns (e.g., Al/Cu) used to wire up the individual semiconductor devices (FETs).

In recent years portions of the AlCu metallization have been replaced with copper (Cu) to significantly reduce the resistivity of the conductive metal lines and thereby improve the RC (resistance×capacitance) delay time and improve circuit performance.

Generally the capacitors can be integrated into the circuit with few additional process steps. The capacitance C for the capacitor is given by the expression $$C = eA/d$$

where e is the dielectric constant, A is the capacitor area, and d is the thickness of the capacitor dielectric layer between the two capacitor electrodes. Typically the figure of merit Q for a capacitor in a circuit is $X_c/R$, where $X_c$ is the capacitor reactance expressed in ohms, and R is the resistance (ohms) in series with the capacitance reactance. To improve the figure of merit it is desirable to maximize $X_c$ while minimizing the R. In conventional capacitor structures multiple contacts are made to the relatively thin capacitor top metal (CTM) electrode to minimize resistance and improve the figure of merit Q. This is best understood with reference to FIG. 1. As shown in FIG. 1, when a more conventional MIM capacitor C is formed on the partially completed CMOS substrate 10, the CBM electrode is formed from an upper interconnecting metallurgy layer 15 of TiN/AlCu/TiN. An interelectrode dielectric layer 17 is formed on the CBM electrode top surface. A capacitor top metal (CTM) electrode is formed from a patterned relatively thin AlCu/TiN layer 19, and a planar insulating layer 21 is formed over the capacitor to insulate the capacitor and provide support for the next level of metal interconnections 25. A TiN/AlCu/TiN layer is then deposited and patterned to form the next level of metal interconnections. Vias (holes) 23 are etched in the insulating layer 21 to make contact to the CBM electrode 15 and the CTM electrode 19. Unfortunately, to minimize the series resistance R to the capacitor it is necessary to etch a series of closely spaced vias 23. For example, U.S. Pat. No. 5,926,359 to Greco et al., and U.S. Pat. No. 5,946,567, to Weng et al. are similar to the capacitor structure depicted above. In U.S. Pat. No. 5,406,447 to Miyazaki, a method is described for making an MOS, MIS, or MIM capacitor incorporating a high-dielectric material, such as tantalum oxide, strontium nitrate and the like, as the interelectrode dielectric layer. In U.S. Pat. No. 5,812,364 to Oku et al., a method is described for making a compatible MIM capacitor on a gallium arsenide substrate, but does not address the method of making MIM capacitors integrated with copper metallization schemes for CMOS devices on silicon substrates.

There is still a need in the semiconductor industry to form metal-insulator-metal (MIM) capacitors with high capacitance and low series resistance for improved figure of merit Q for advanced Cu metallization schemes on integrated circuits.

SUMMARY OF THE INVENTION

A principal object of the present invention is to fabricate a Metal-Insulator-Metal (MIM) capacitor structure having a high figure of merit Q for improved circuit performance using CMOS technology.

A second object of this invention is to provide this improved capacitor using a Cu damascene process to form the Capacitor Bottom Metal (CBM) and using a patterned pad protection layer for the Capacitor Top Metal (CTM), which is also patterned to form a level of metal interconnections and to protect the pad contacts.

A third object of this invention is to use an insulating protecting buffer layer, which is used to protect the Cu CBM layer from reacting with the $SiO_2$ interelectrode dielectric layer for the MIM capacitor, that also serves as a portion of the interelectrode dielectric layer.

A further object of the present invention by a second embodiment is another method of fabricating a Metal-Insulator-Metal (MIM) capacitor having a high figure of merit Q requiring no additional masks or metal layers.

In accordance with the objects of the present invention, a method is described for making MIM capacitors having high figure of merit Q by reducing the series resistance associated with the capacitor. The method is compatible with the copper damascene process for CMOS circuits having planar surfaces formed by chemical/mechanical polishing (CMP).

The method for making MIM capacitors for CMOS circuits begins by providing a semiconductor substrate having partially completed CMOS circuits including several levels of electrical interconnections. The next level of metal interconnections is formed by the damascene process, which involves depositing a first insulating layer, for example a chemical-vapor-deposited (CVD) $SiO_2$, and etching recesses for CBM electrodes, pad contacts, and the next level of metal interconnections. Typically for the damascene process, a barrier layer is deposited on the first insulating layer, and a Cu layer is deposited by either physical vapor deposition (PVD) or by electroplating. The Cu layer is then polished back to form the CBM electrodes, the pad contacts and interconnections in the recesses. Next an insulating protecting buffer layer is deposited. This buffer layer prevents the underlying Cu layer from direct contact with the $SiO_2$ layer (the interdielectric layer) that would cause Cu corrosion. Then a second insulating layer, for example $SiO_2$, is deposited on the insulating protecting buffer layer to serve as a portion of a capacitor interelectrode dielectric layer. Alternatively, if the capacitor interelectrode dielectric layer is silicon nitride ($Si_3N_4$), then the insulating protecting buffer layer is not required.

Continuing with the process, a conducting metal protect buffer layer, such as TiN, TaN, Ta, or Ti is deposited to protect the second insulating layer during the photoresist processing. A first photoresist layer is deposited. A pad contact mask is used to expose and develop the first photoresist, and plasma etching is used to etch pad contact openings (windows) and interconnect contact openings in the metal protect buffer layer and the second insulating layer to the insulating protecting buffer layer. The remaining first photoresist layer is then removed. Next the insulating protecting buffer layer in the contact openings is removed to the underlying Cu layer, and a blanket pad protection metal layer is deposited. The pad protection metal layer, which is preferably TaN/Al/TaN or TaN/AlCu/TaN, protects the Cu from corrosion and also serves as the next level of interconnections. A second photoresist mask and plasma etching are used to pattern the blanket pad protection metal layer to form pad protection over the pads, and to also form capacitor top metal (CTM) electrodes, and to form the next level of interconnecting lines. A passivating third insulating layer, such as PECVD silicon nitride and high density plasma (HDP) oxide is deposited to protect the underlying patterned metallurgy. A third photoresist layer is deposited and is exposed through the pad contact mask and developed to provide openings. The third photoresist mask is now used to plasma etch openings through the passivating third insulating layer to the pad protection over the pads and to the CTM electrodes. The remaining third photoresist layer is then removed to complete the MIM capacitor integrated with the CMOS circuit.

In a second embodiment the process is similar to the first embodiment up to and including the formation of the interelectrode dielectric layer. In this second embodiment pad contact openings and vias are etched in the insulating protecting buffer layer and the second insulating layer. The pad contact openings are etched to the Cu pad contacts, and the vias are etched for the electrical interconnections. The next level of metal, consisting of TiN/AlCu/Ti, is deposited and patterned to form the next level of metal interconnections and concurrently form the capacitor top metal (CTM) electrodes. This results in a relatively thick CTM electrode having low series resistance and a low-series-resistance Cu CBM electrode that provides a higher figure of merit Q ($X_c/R$). The remaining process steps are similar to the first embodiment. A passivation layer is deposited and openings are etched for the pad contacts.

BRIEF DESCRIPTION OF TEE DRAWINGS

The objects and other advantages of this invention are best understood with reference to the preferred embodiments when read in conjunction with the following drawings.

FIG. 1 shows a schematic cross-sectional view of a prior-art capacitor requiring multiple contacts to the top metal plate to reduce resistance.

FIG. 2 is a schematic top view of a MIM capacitor by the method of this invention for the first embodiment.

DESCRIPTION OF THE PREFERRED EMBODIMENTS

The present invention relates to a method for making metal-insulator-metal (MIM) capacitors with increased figure of merit Q while concurrently forming pad contacts and electrical interconnections for the CMOS circuits. The method is compatible with the Cu dam scene process for CMOS circuits having planar surfaces formed by CMP. These MIM capacitors are used in many mixed-signal (analog/digital) and radio frequency (RF) circuit applications. The method of this invention utilizes an insulating protecting buffer layer and a blanket pad protection metal layer to form these improved MIM capacitors. The partially completed CMOS circuits on which these MIM capacitors are built are not explicitly shown in the figures to simplify the drawings and discussion. However, these MIM capacitors are formed on a semiconductor substrate having partially completed CMOS circuits that include P-channel and N-channel FETs and several levels of electrical interconnections.

Figure 10:
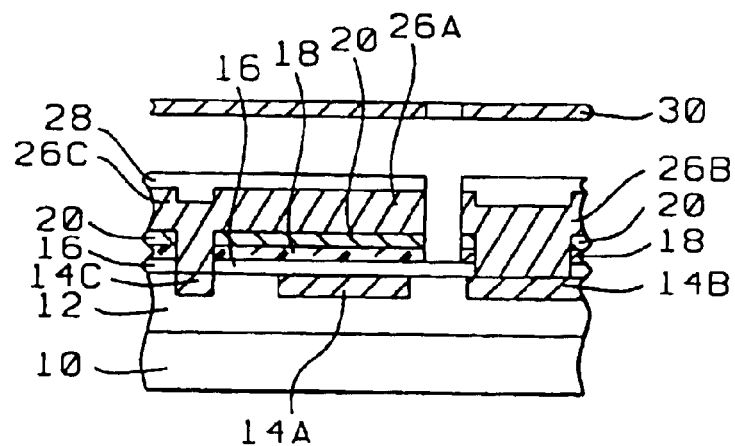

FIG. 2 shows a schematic top view of a MIM capacitor and a pad contact completed up to and including the CTM electrode, shown in cross section in FIG. 10, and fabricated by the method of a first embodiment. The figure shows a patterned capacitor bottom metal electrode 14A, a pad contact 14B, and a level of metal interconnections 14C formed by a Cu damascene process on a partially completed substrate 10. An insulating protective buffer layer 16, an interelectrode dielectric layer 18, and a metal protect buffer layer 20 are formed on the patterned Cu. Openings 3 are etched to the pad contacts 14B and openings 5 are etched to the metal interconnections 14C. A blanket pad protection metal layer 26, composed of TiN/AlCu/TiN, is deposited to protect the exposed Cu. The TiN/AlCu/TiN layer 26, the conducting metal protect buffer layer 20, and the interelectrode dielectric layer 18 are patterned to form a protective buffer layer 26B over the pad contact 14B, and also patterned to form the capacitor top metal electrode 26A, and to form another level of metal interconnections 26C.

Figure 3:
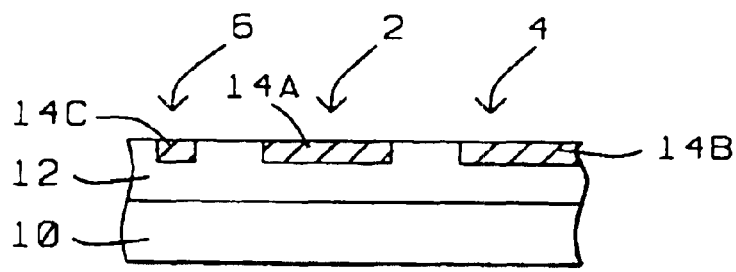
FIGS. 3 through 12 are schematic cross-sectional views for the sequence of process steps for making a MIM capacitor while concurrently protecting the Cu pad contacts for a CMOS circuit formed by the first embodiment of this invention.

FIG. 3 shows a schematic cross-sectional view of the upper portion of a semiconductor substrate. The method for making these improved MIM capacitors for CMOS circuits begins by providing the semiconductor substrate having partially completed CMOS circuits including several levels of electrical interconnections. Although this partially completed substrate is not depicted in the figures, the substrate is typically a single-crystal silicon substrate having a <100> crystallographic orientation. The CMOS circuits are typically formed from P-channel and N-channel field effect transistors (FETs) and the electrical inter-connections are typically formed from patterned polycide layers and several patterned metal layers, such as AlCu, and in more advanced circuits, formed from Cu.

Continuing with FIG. 3, the next level of metal interconnections is formed by the damascene process. A first insulating layer 12 is deposited on the partially completed substrate 10. Layer 12 is preferably a CVD $SiO_2$ deposited, for example, using tetraethosiloxane (TEOS) or TEOS/ozone as the reactant gas. First insulating layer 12 is deposited to a thickness of between about 10000 and 12000 Angstroms. Using conventional photolithographic techniques and anisotropia etching, recesses (trenches) are etched for capacitor bottom metal (CBM) electrodes 2, for pad contacts 4, and for the next level of metal interconnections 6, a portion of which is shown FIG. 3. The recesses are etched to a preferred depth of between about 6000 and 8000 Angstroms. A conformal barrier layer (not shown) is deposited on the first insulating layer 12 and in the trenches. Typically the barrier layer is TaN. Next, a Cu layer 14 is deposited to fill the trenches (2, 4, and 6) and more specifically to a thickness of between about 6000 and 8000 Angstroms. The Cu layer 14 is deposited preferably using electroplating, but physical vapor deposition can also be used. The Cu layer 14 is then chemically-mechanically polished back to form the CBM electrodes 14A, the pad contacts 14B, and the metal interconnections 14C.

Figure 4:
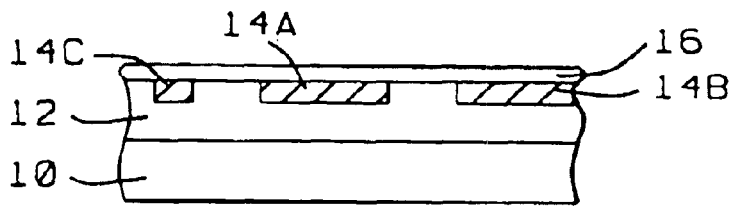

Referring next to FIG. 4, an insulating protecting buffer layer 16 is deposited. Layer 16 is preferably composed of $Si_3N_4$ and is used to protect the Cu layer 14 from reacting with the $SiO_2$ layer that is formed next. The insulating protecting buffer layer 16 is formed by PECVD using, for example, dichlorosilane ($SiCl_2H_2$) and ammonia ($NH_3$) as the reactant gas mixture, and is deposited to a thickness of between about 150 and 300 Angstroms.

Figure 5:
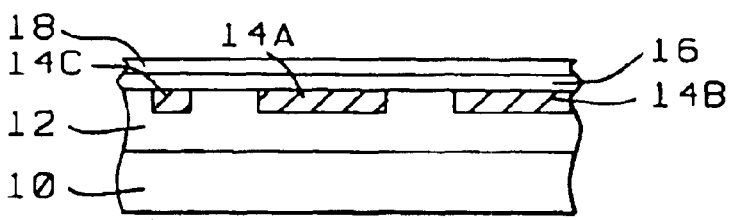

Referring now to FIG. 5, a second insulating layer 18 is deposited on the insulating protecting buffer layer 16 to serve as a portion of the capacitor interelectrode dielectric layer. Layer 18 is preferably $SiO_2$, deposited by plasma-enhanced CVD (PECVD), using a reactant gas such as TEOS. Second insulating layer 18 is deposited to a thickness of between about 150 and 300 Angstroms. Alternatively, the capacitor interelectrode dielectric layer 18 can be $Si_3N_4$, and then the insulating protecting buffer layer 16 is not required.

Figure 6:
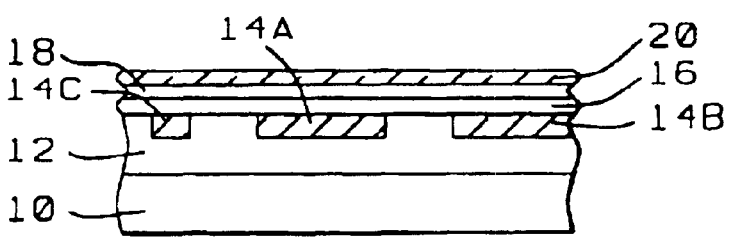

Referring to FIG. 6, a conducting metal protect buffer layer 20 is deposited to protect the second insulating layer 18 during photoresist processing. Layer 20 is preferably composed of TaN and is deposited by PVD. Layer 20 is deposited to a thickness of between about 500 and 700 Angstroms.

Figure 7:
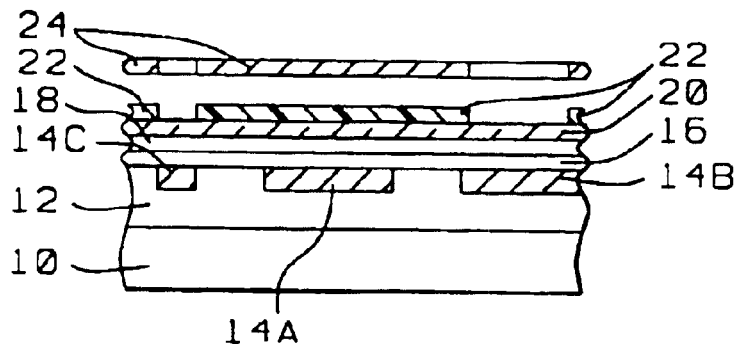

Referring to FIG. 7, a first photoresist layer is deposited on the conducting metal protect buffer layer 20. A pad contact mask 24 is used to expose the first photo-resist, and the photoresist is developed to provide an etch mask 22.

Figure 8:
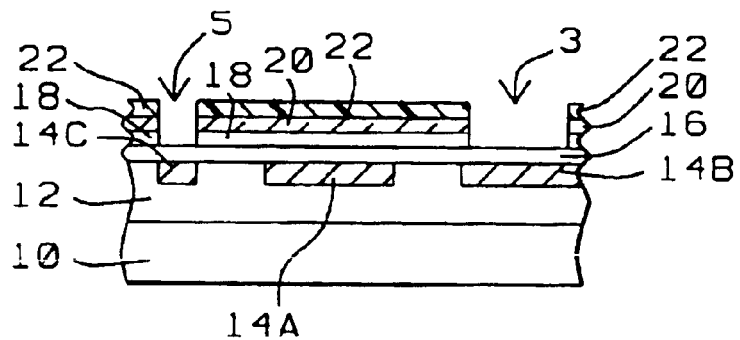

Referring now to FIG. 8, the photoresist mask 22 and anisotropic plasma etching are used to etch pad contact openings (windows) 3 and interconnect contact openings 5 in the metal protect buffer layer 20 and the second insulating layer 18 to the insulating protecting buffer layer 16. The metal protect buffer layer 20, and the second insulating layer 18 are etched using dry etching.

Figure 9:
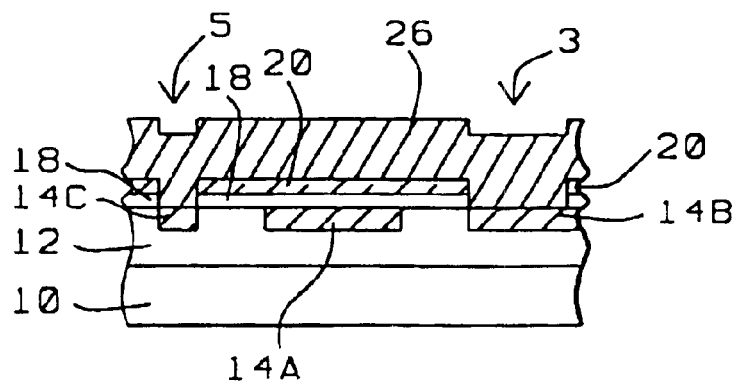

Referring to FIG. 9, the remaining first photoresist layer 22 is removed, for example by plasma ashing in oxygen ($O_2$) and/or by wet stripping. Next the insulating protecting buffer layer 16 exposed in the contact openings 3 and 5 is removed to the underlying Cu layer 14. The $Si_3N_4$ insulating protecting buffer layer 16 is removed by etching.

Continuing with FIG. 9, a blanket pad protection metal layer 26 is deposited. Layer 26 is preferably composed of TiN/Al/TiN or TiN/AlCu/TiN, and is deposited by PVD. The TiN is deposited to a thickness of between about 200 and 500 Angstroms, and the Al or AlCu alloy is deposited to a thickness of between about 8000 and 10000 Angstroms. The pad protection layer 26 protects the exposed Cu in the openings 3 and 5 from corrosion and contamination from the ambient. Layer 26 also serves as the next level of interconnections.

Referring to FIG. 10, a second photoresist layer 28 is deposited on the blanket pad protection metal layer 26. A second photoresist mask 30 is used to expose the second photoresist, and the photoresist is developed to provide an etch mask 28. The etch mask 28 and anisotropic plasma etching are used to pattern the blanket pad protection metal layer 26 to form pad protection 26B over the pads 14B, and concurrently to form the capacitor top metal (CTM) electrode 26A and to form the next level of metal interconnections 26C. The TiN/AlCu/TiN layer 26 is patterned using reactive ion etching and a chlorine based etchant gas. The conducting metal protect buffer layer 20 is also etched using a chlorine based etchant gas. The second insulating layer 18 (interelectrode dielectric layer) is etched selectively to the insulating protect buffer layer 16 also using RIE and an chlorine based etchant gas. The above etching process steps can be carried out sequentially in the same etching chamber. This etching step electrically isolates the CTM electrodes 26A from the pad protection over the pads 26B. A key feature of this invention is that the CTM electrodes 26A are formed directly on the conducting metal protect buffer layer 20, which provides low resistance in series to the capacitor and improves the figure of merit Q.

Figure 11:
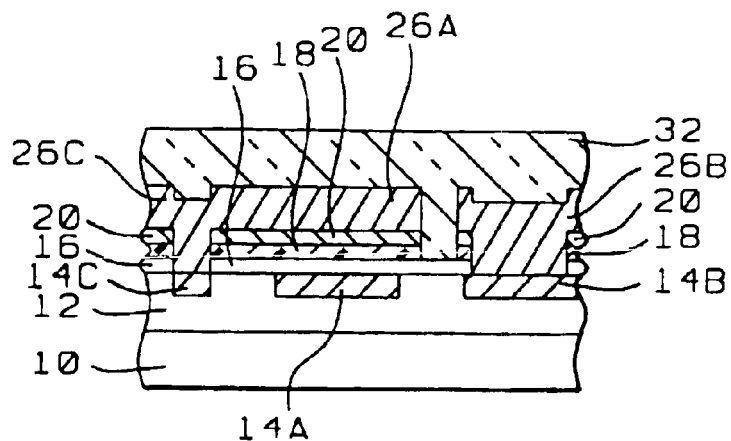

Referring to FIG. 11, a passivating third insulating layer 32 is deposited. Layer 32 is preferably composed of a CVD silicon nitride layer and a HDP oxide layer using a PECVD to a thickness of between about 17000 and 20000 Angstroms.

Figure 12:
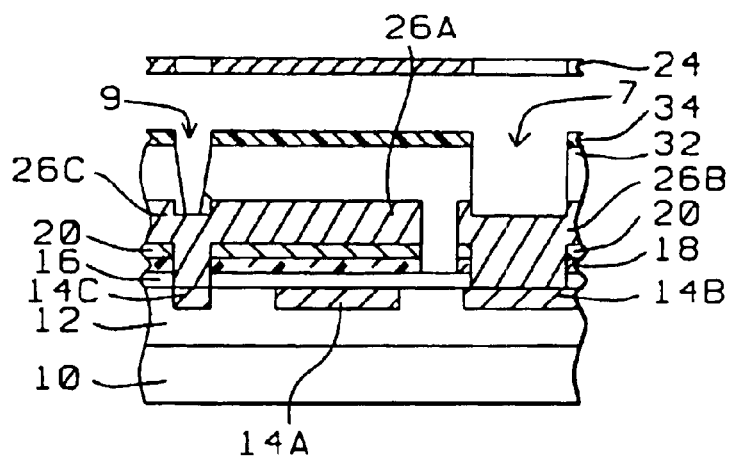

Referring to FIG. 12, a third photoresist layer 34 is deposited by spin coating and is exposed through the pad contact mask 24 and developed to provide openings 7 in the photoresist over the pad contacts 14B. The photoresist mask 34 and RIE are used to etch vias in the passivation layer 32 to the pad protection 26B over the pad contacts 14B.

Concurrently, openings 9 are etched to the interconnecting metallurgy 26C. Another key feature of this invention is that the pad contact mask 24 used to etch openings 3 and 5 is also used to etch the openings 7 and 9, thereby reducing the mask set. The remaining third photoresist layer is then removed to complete the MIM capacitor integrated with the CMOS circuit.

Figure 13:
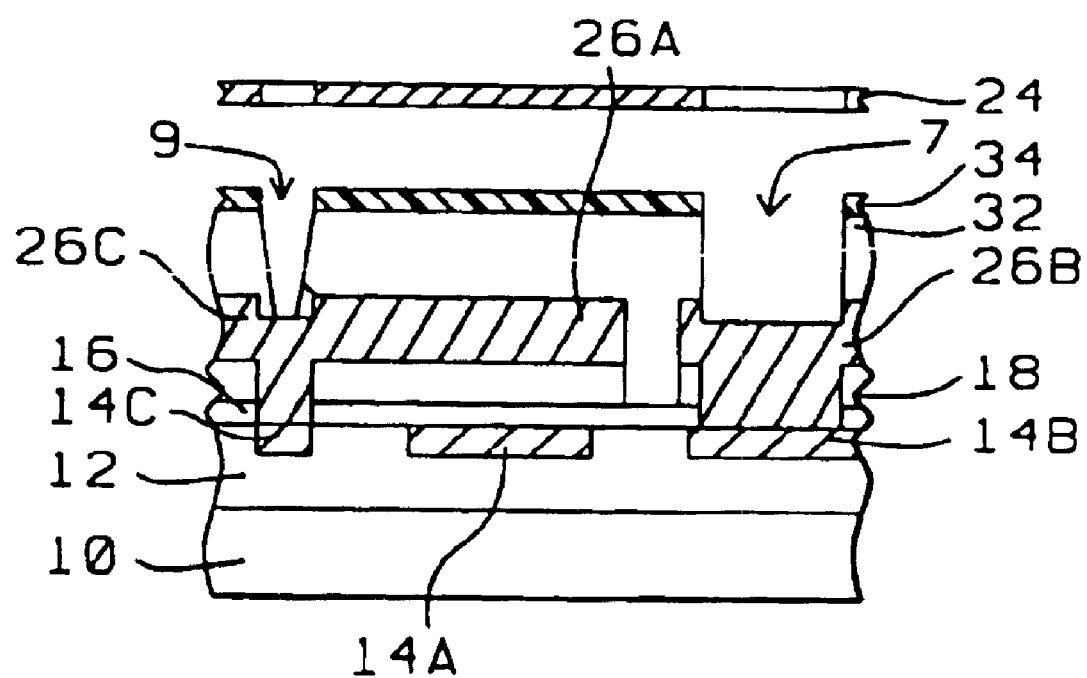
FIG. 13 show schematic cross-sectional views for the a MIM capacitor for the method of a second embodiment of this invention in which a layer is removed to simplify the process.

Referring to FIG. 13, a method for making a MIM capacitor is described by a second embodiment. The second embodiment is similar to the first embodiment, but without including the conducting metal protect buffer layer 20.

While the invention has been particularly shown and described with reference to the preferred embodiments thereof, it will be understood by those skilled in the art that various changes in form and details may be made without departing from the spirit and scope of the invention.

What is claimed is:

1. A metal-insulator-metal (MIM) capacitors for CMOS circuits on a semiconductor substrate comprised of:
   - a semiconductor substrate having partially completed CMOS circuits including several layers of metal interconnections;
   - a first insulating layer having recesses for capacitor bottom metal (CBM) electrodes, pad contacts, and a level of metal interconnections;
   - copper in said recesses that form CBM electrodes, pad contacts, and a level of metal interconnections;
   - an insulating protecting buffer layer and a second insulating layer over said CBM electrodes that serves as a portion of an interelectrode dielectric layer;
   - a conducting metal protect buffer layer on said second insulating layer;
   - a patterned titanium nitride/aluminum copper/titanium nitride blanket pad protection metal layer to form capacitor top metal (CTM) electrodes, pad protection on said pad contacts, and next level of metal interconnecting lines;
   - a passivating third insulating layer having openings to said pad protection over said pads and to said CTM electrodes.

2. The structure of claim 1, wherein said first insulating layer is silicon oxide having a thickness of between about 10000 and 12000 Angstroms, and said recesses have a depth of between about 6000 and 8000 Angstroms.

3. The structure of claim 1, wherein said insulating protecting buffer layer is silicon nitride having a thickness of between about 150 and 300 Angstroms.

4. The structure of claim 1, wherein said second insulating layer is silicon oxide having a thickness of between about 150 and 300 Angstroms.

5. The structure of claim 1, wherein said conducting metal protect buffer layer is tantalum nitride having a thickness between about 500 and 700 Angstroms.

6. The structure of claim 1, wherein said conducting metal protect buffer layer is titanium nitride having a thickness of between about 500 and 700 Angstroms.

7. The structure of claim 1, wherein said pad protection metal layer has titanium nitride layers with a thickness of between about 200 and 500 Angstroms and has an aluminum copper alloy layer with a thickness of between about 8000 and 10000 Angstroms.

8. The structure of claim 1, wherein said passivating third insulating layer is composed of composed of a layer of silicon nitride and a silicon oxide and is formed to a thickness of between about 17000 and 20000 Angstroms.

* * * * *